(12) United States Patent
Kaufmann et al.

(10) Patent No.: US 10,236,607 B2
(45) Date of Patent: Mar. 19, 2019

(54) CONTACTING DEVICE

(71) Applicant: TDK-Micronas GmbH, Freiburg (DE)

(72) Inventors: Timo Kaufmann, Waldkirch-Suggental (DE); Johannes Gutmann, Staufen (DE); Mike Kunze, Senden (DE); Klaus Heberle, Emmendingen (DE); Till Feger, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 0 days.

(21) Appl. No.: 15/678,562

(22) Filed: Aug. 16, 2017

(65) Prior Publication Data
US 2018/0054008 A1    Feb. 22, 2018

(30) Foreign Application Priority Data
Aug. 16, 2016   (DE) .................. 10 2016 009 841

(51) Int. Cl.
| H01R 12/00 | (2006.01) |
| H01R 12/71 | (2011.01) |
| H01R 13/24 | (2006.01) |
| H05K 7/10 | (2006.01) |
| H01R 12/70 | (2011.01) |

(52) U.S. Cl.
CPC ......... *H01R 12/714* (2013.01); *H01R 13/245* (2013.01); *H05K 7/10* (2013.01); *H05K 7/1023* (2013.01); *H05K 7/1061* (2013.01); *H01R 12/7076* (2013.01)

(58) Field of Classification Search
CPC ............................ H01R 23/725; H01R 23/684
USPC ...... 439/74, 71, 70, 330, 331, 525, 526, 357
See application file for complete search history.

(56) References Cited

U.S. PATENT DOCUMENTS

| 5,528,466 A | 6/1996 | Lim et al. | |
| 5,803,752 A * | 9/1998 | McHugh | H01R 12/79 439/495 |
| 5,964,594 A * | 10/1999 | Saitoh | H01R 12/716 439/67 |
| 6,793,506 B1 * | 9/2004 | Hirata | H01R 12/716 439/65 |
| 7,344,387 B2 * | 3/2008 | Shiroyama | H01R 13/20 439/660 |

(Continued)

FOREIGN PATENT DOCUMENTS

| DE | 11 2010 004 846 | 10/2012 |
| JP | 2004-085424 A | 3/2004 |

*Primary Examiner* — Phuong Chi T Nguyen
(74) *Attorney, Agent, or Firm* — Muncy, Geissler, Olds & Lowe, P.C.

(57) ABSTRACT

A contacting device having a carrier and at least one contacting unit, wherein the carrier has a bottom side and a top side, the top side of the carrier having a plurality of mutually insulated conductive tracks, the contacting unit having a plurality of contact elements that at least partially are formed of an electrically conductive material and in each case are mutually electrically insulated, each contact element along a longitudinal axis being composed of at least one fixing section and a contacting portion adjoining the fixing section, each fixing section being supported on the top side of the carrier, having a first contact surface and being positively and conductively connected to one of the conductive tracks, each contacting portion having a distance to the top side varying between zero and a maximum distance.

23 Claims, 3 Drawing Sheets

(56) References Cited

U.S. PATENT DOCUMENTS

| | | | | |
|---|---|---|---|---|
| 7,845,987 B2* | 12/2010 | Yamada | ............... | H01R 12/716 439/680 |
| 8,182,272 B2* | 5/2012 | Ooi | ...................... | H01R 12/716 439/660 |
| 2009/0302876 A1 | 12/2009 | Koizumi et al. | | |
| 2011/0151681 A1 | 6/2011 | Beaman | | |

* cited by examiner

CONTACTING DEVICE

This nonprovisional application claims priority under 35 U.S.C. § 119(a) to German Patent Application No. 10 2016 009 841.4, which was filed in Germany on Aug. 16, 2016, and which is herein incorporated by reference.

BACKGROUND OF THE INVENTION

Field of the Invention

The invention relates to a contacting device.

Description of the Background Art

Contacting devices are known from DE 11 2010 004 846 T5 (which corresponds to US 2011/0151681), U.S. Pat. No. 5,528,466 and JP 2004 085 424 A.

Furthermore, US 2009/0302876 A1 describes a contacting device for testing a plurality of electronic components, in particular ICs, wherein the contacting device has a plurality of contacting units, which are arranged on a carrier for each respective component to be tested, and a pressing device. An electrical operative connection is achieved by placing the contact connections, the so-called pins, on the contact surfaces of the contacting device. In this case, the components are distanced from the carrier. By means of a pressing device, the component is in each case pressed against the carrier, the position and size of the area of contact between the component and the contacting unit varying in accordance with the stroke traveled. Subject to the deformability of the contact pins and the force exerted by the pressing device, the contact pins are bent.

SUMMARY OF THE INVENTION

It is therefore an object of the invention to provide a device which develops the state of the art.

According to an exemplary embodiment of the invention, a contacting device with a carrier and at least one contacting unit is provided, the carrier having a bottom side and a top side, and the top side of the carrier having a plurality of conductive tracks insulated from each other.

The contacting unit has a plurality of contact elements including, in part, an electrically conductive material, which are each electrically insulated from one another, each contact element being formed along a longitudinal axis of a contact element and having a fixing section and a contacting portion, which adjoins the fixing section.

Each fixing section rests on the top side of the carrier, has a first contact surface and is non-positively and conductively connected to the first contact surface with one of the conductive tracks.

Each contacting portion has a distance to the top side which varies between zero and a maximum distance, is elastic in a direction extending perpendicularly to the top side of the carrier and has a second contact surface facing away from the top side of the carrier in an area distanced from the top side.

The second contact surface of the contacting portion and the first contact surface of the fixing section are electrically conductively connected by the electrically conductive material to provide an electrical operative connection between a terminal contact of an electrical or electronic component resting on the second contact surface and one of the conductive tracks.

It should be noted that the longitudinal axis designates an extension direction of the contact element, wherein the different sections follow each other along the direction of extension and the variation of the distance of the contact element from the surface of the carrier takes place along the direction of extension.

The carrier can be embodied as a printed circuit board, whereby an unbundling can be carried out by means of the conductive tracks or the PCB track planes. It should be noted that it is preferred to connect each contact area to the evaluation circuit by means of a conductive track section, i.e., the electrical operative connection is effected by means of a conductive track section. The conductive tracks can be arranged in several layers on the carrier.

The component can be designed as a housed integrated circuit, i.e., as a housed IC or as a housed electrical component, wherein in the following, the concept of the semiconductor housing is used synonymously. At least a part of the terminal contacts or all terminal contacts are formed on the outer side of the housing.

The contacts can be formed on an outer side of the housing as so-called "balls" or as legs or contact lugs. It is noted that by means of the terminal contacts non-positively resting on the second contact surfaces of the contact elements, the components can be subjected to a voltage and/or a current and, for example, a functional test of the components can be carried out. In doing so, an elastic deformation of the contact elements is produced by a contact pressure, but without a plastic or irreversible deformation of the terminal contacts of the components.

The contacting device can be designed as part of a measuring system, wherein the evaluation circuit is formed in the measuring system. Such measuring systems can also be referred to as "final testers" and are used in particular in the final measurement in IC production. In this case, the housed IC to be measured or the component rests on the contact areas, with the contacts formed on the outer side of the IC housing or the component in order to establish an electrical contact. In order to establish the electrical operative connection between the contacting device and the measuring system, a plug or a contact strip can be configured on the carrier.

The electrically conductive material can be advantageously formed in one piece and can comprise a metal or a metallic compound. The electrically conductive material or the entire contact element can at least be partially elastic in order not to be deformed or to tear off when the contact elements are deflected.

Each contact element is formed completely of or at least substantially of the conductive material, and an electrical insulation of the contact elements is achieved by means of a spaced arrangement of the contact elements.

When the component is supported, the contact elements are already deflected in the direction of the top side of the carrier as a result of the weight of the component and the elasticity of the contact elements of the contacting unit, so that the distance between the contacting portion of the contact elements and the top side of the carrier at least partially decreases.

A modulus of elasticity and the geometrical dimensions of the contact elements, such as the width and the length of each contact element or the shape, length and height of the rise of the contacting portion are selected with respect to the surface of the carrier, according to the contact pressure on the contact elements.

In order to achieve a particularly reliable contacting, the component can be subjected to a force. For example, the contacting device has a pressing device for pressing the component onto the second contact surface or the second contact surfaces. As a result, the contacting portions of the contact elements are additionally deflected in the direction of the top side of the carrier, and the component can be fixed to the contact elements of a contacting unit. In an embodiment, the carrier material comprises a composite material.

An advantage of the device according to the invention is that as a result of the elasticity of the contact elements of the contacting unit, in particular in the field of measurement technology, housed components, such as, for example, ICs, can be measured simply, cost-effectively and reliably. After measurement, the components can again be removed from the conductive areas. Furthermore, the contact elements of the contacting unit return to the initial position due to the spring properties, wherein studies have shown that the service life of the device according to the invention is long.

A further advantage is that the pins of the components, in particular of the ICs, can be pressed directly onto the contacting portions of the contact elements by means of the pressing device, i.e., no leverage occurs along the pins. In other words, the pins are not inelastically deformed in the longitudinal direction.

A further advantage is that during contacting and measurement, the electronic components are mechanically stressed as little as possible and, unlike in a soldering process or when pressing into an adapter, are not deformed. This prevents the component from being subjected to mechanical stresses which impair the functioning of the component, e.g., during testing and adjusting of Hall effect sensors. Another advantage is that with the spring properties of the contact elements, height tolerances between the various contacts of the component can be compensated. This makes it possible to increase the reliability of the contacting of the electrical contacts of the component with the areas or the contact surfaces of a contacting unit.

Another advantage is that the contacting units can be manufactured cost-effectively and simply as a structure in the large PCB panel. Furthermore, the arrangement on the carrier and the connection of the contacting units to the carrier surface can also be made quickly and simply by arranging and, for example, soldering the structure.

Studies have shown that a bending-beam-like configuration of the contact elements with a ramp connecting two plateaus is particularly suitable.

According to an embodiment, each contact element is formed, at least substantially, of a non-magnetic material.

In an embodiment, each contact element is formed at least substantially of a metal or a metallic compound, a width of the contact elements being between 0.02 mm and 2 mm and/or a length of the contact elements being 0.2 mm to 5 cm. An advantage is that in the case of a metallic strip-shaped or tongue-shaped embodiment, forming the individual contact surfaces of metal is superfluous. In the case of the metallic strip-shaped or tongue-shaped design, the formation of conductive track sections for producing an electrical operative connection between the first contact surface and the second contact surface is also redundant. By means of a step-shaped or ramp-shaped configuration of the contact element, a spring effect is achieved. It is particularly preferred to form the contacting unit, in particular the contact elements, at least substantially from copper-beryllium.

In an embodiment, the at least one contacting unit has a plurality of contact elements arranged in parallel next to one another, by which a plurality of terminal contacts of a component, located side by side, can be brought substantially simultaneously into contact by means of one of the contact elements.

According to an embodiment, the at least one contacting unit has at least one pair of contact elements formed of a first contact element and a second contact element, the longitudinal axis of the first contact element and the longitudinal axis of the second contact element coinciding with a common longitudinal axis, and the first contact element being disposed in a mirror relationship to the second contact element along the common longitudinal axis.

The contacting device can have a plurality of pairs of contact elements extending in parallel and arranged side by side. By means of the mirrored arrangement, simultaneous contacting of terminal contacts of a component is possible, which are arranged on two opposite sides of the component.

In an embodiment, a plurality of contacting units are arranged on the carrier, the contacting units being arranged, for example, in a form of arrays in order to substantially simultaneously connect a plurality of components with the contact areas.

In an embodiment, each contact element has a second fixing section along the longitudinal axis, which adjoins the contacting portion and runs parallel to the top side of the carrier. By means of the fixing section, the stability of the contact element increases. The spring force can also be increased by virtue of the fact that the contact element is non-positively connected to the carrier.

The second fixing section can be arranged on the top side of the carrier and/or is connected non-positively to the top side of the carrier, wherein the second fixing section has a third contact surface which is electrically conductively connected to the second contact area, the third contact surface being non-positively and conductively connected to one of the conductive tracks. An embodiment provides an omega-shaped contact element in a side view.

An embodiment of the contact element can have a step-like configuration with an increase in the distance to the maximum distance, which is oblique or sigmoid relative to the top side of the carrier.

In an embodiment, the contacting device has a base carrier comprising a surface with a plurality of conductive tracks, wherein a plurality of carriers are arranged with the bottom side on the base carrier and are connected non-positively to the surface of the base carrier and/or the conductive tracks of the base carrier, the carriers have a feedthrough contact extending from the conductive track to the bottom side of the carrier, and the feedthrough contacts are electrically connected to the conductive tracks of the base carrier. In this way, a modular construction of the contacting device with different and/or similar contacting units or subunits is possible, a further unbundling being carried out by the conductive tracks of the base carrier.

During a test run, a terminal contact of a housed integrated circuit is supported on the second contact surface of each contact element.

In an embodiment, an elastic material can be arranged between the contacting portion of each contact element and the top side of the carrier. It is preferable to make the hardness of the elastic material substantially softer than the hardness of the contact elements of the contacting units. In particular, elastomers and/or blastomeres are included in the elastic material. For example, foams are well suited to at least partially fill the space between the fixing section of the contact elements and the top side of the carrier. As a result, a restoring force is generated and the contact areas are returned to the initial position, as long as the component no longer is supported or no pressing force presses on the component.

In an embodiment, the second contact surface is formed in an area having the maximum distance to the top side of the carrier.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
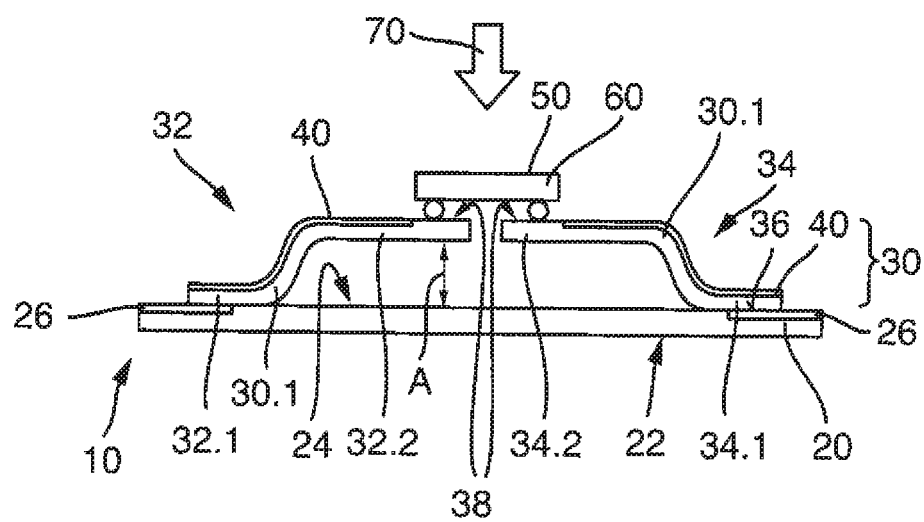
FIG. 1 is a cross-sectional view of an embodiment of a contacting device according to the invention.

FIG. 1 shows a schematic view of a first embodiment comprising a contacting device 10 with a carrier 20 and a contacting unit 30, the carrier 20 having a bottom side 22, a top side 24 and several conductive tracks 26 formed on the top side 24, and the contacting unit 30 being arranged on the top side 24 of the carrier 20.

In the illustrated embodiment, the contacting unit 30 has at least one first contact element 32 and one second contact element 34. The contact elements 32, 34 are arranged at a distance from each other and are disposed in an electrically insulated manner on the top side 24 of the carrier 20. Each contact element 32, 34 has an electrically conductive material 30.1 and a coating 40, the coating 40 covering in each case a part of a side of the respective contact element 32, 34 facing away from the top side 24 of the carrier 20. Each contact element 32, 34 comprises a fixing section 32.1, 34.1 resting on the top side 24 of the carrier, and a contacting portion 32.2, 34.2 adjoining the fixing section 32.1, 34.1.

Each fixing section 32.1, 34.1 is non-positively and electrically conductively connected to one of the conductive tracks 26 of the top side 24 of the carrier 20, for example, by means of a soldered connection. In the illustrated embodiment, at least the part of a surface connected to the conductive track 26 and facing the carrier 20 forms a first contact surface 36.

In a first sub section opposite the top side 24 of the carrier, each contacting portion 32.2, 34.2 rises from the respective fixing section 32.1, 34.1 in an oblique or ramp-shaped manner, and after reaching a maximum distance A, extends parallel to the top side 24 of the carrier 22 in a second sub section. Each contact element 32, 34 has a stepped shape, the fixing sections 32.1, 34.1 each having a bottom step and the second sub sections of the contacting portions 32.2, 34.2 each forming a top step. On the side of the second sub section facing away from the top side 24 of the carrier 20, each contact element 32, 34 has a second contact surface 38. In the illustrated embodiment, the second contact surface 38 is formed by a part of the surface of the respective contact element 32, 34, which is not covered by the coating 40. Through the use of electrically conductive material 30.1, an electrical operative connection is present between the first contact surface 36 and the second contact surface 38 of each contact element 32, 34.

The contact elements 32, 34 are arranged mirrored on the carrier so that the contact areas 32.1, 32.4 face each other and the second contact surfaces 38 are arranged adjacent to one another.

Above the carrier 20, an electrical or electronic component 50, preferably a housed IC, is arranged. The component 50, also referred to as an IC housing 50, has at least two terminal contacts 60 on the bottom side. In each case, one terminal contact 60 of the component 50 is supported on the second contact surface 38 of one of the two contact elements 32, 34. For better contact between the terminal contacts 60 of the component 50 and the second contact surface 38 of the contact elements 32, 34, a force 70, for example a pressing device (not shown), shown as a vector, presses onto the IC housing 50.

The contacting portions 32.2 and 34.2 of the two contact elements 32 and 34 are each deflected in the direction of the top side 24 of the carrier 20, and the contact elements 32 and 34 are correspondingly deformed. It should be noted that, depending on the elasticity of the two contact elements 32 and 24, a deflection of the contacting portions 32.2 and 34.2 of the contact elements 32 and 34 can already be achieved by the weight of the IC housing 50.

In an embodiment, which is not shown, the IC housing 50 has pins arranged laterally on the housing that are known as terminal contact lugs or legs. In order not to deform the pins inelastically along their respective longitudinal extent, it is preferred to apply the pressing force at least partially, or preferably completely, to the legs. Most preferably, the pressing force partially or exclusively acts on the region of the area of the pin resting on the contact element.

Figure 2:
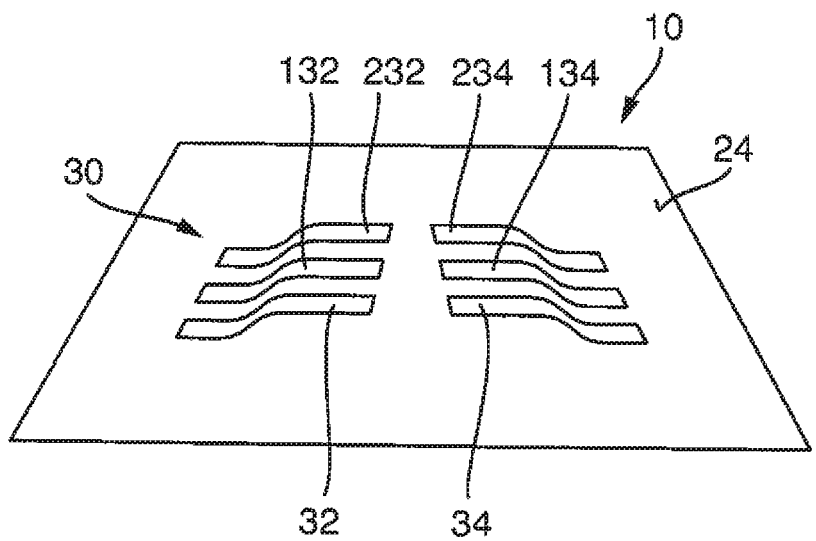
FIG. 2 is a perspective view of a simplified representation of the exemplary embodiment in FIG. 1.

FIG. 2 shows a perspective view of the embodiment according to FIG. 1. In the following, only the differences from the illustration of FIG. 1 are explained. In each case, three pairs of oppositely mirrored contact elements 32, 34 and 132, 134 and 232, 234 are arranged extending parallel to one another, side by side and at a distance from each other. All the contact elements 32, 34, 132, 134, 232 and 234 together form a contacting unit 30. Each of the contact elements 32, 34, 132, 134, 232 and 234 has a first contact surface 36 and a second contact surface 38 (not shown). With the present embodiment, electrical or electronic components 50, e.g., ICs, with up to six terminal contacts can be contacted simply and reliably by means of a contacting unit 30.

Figure 3:
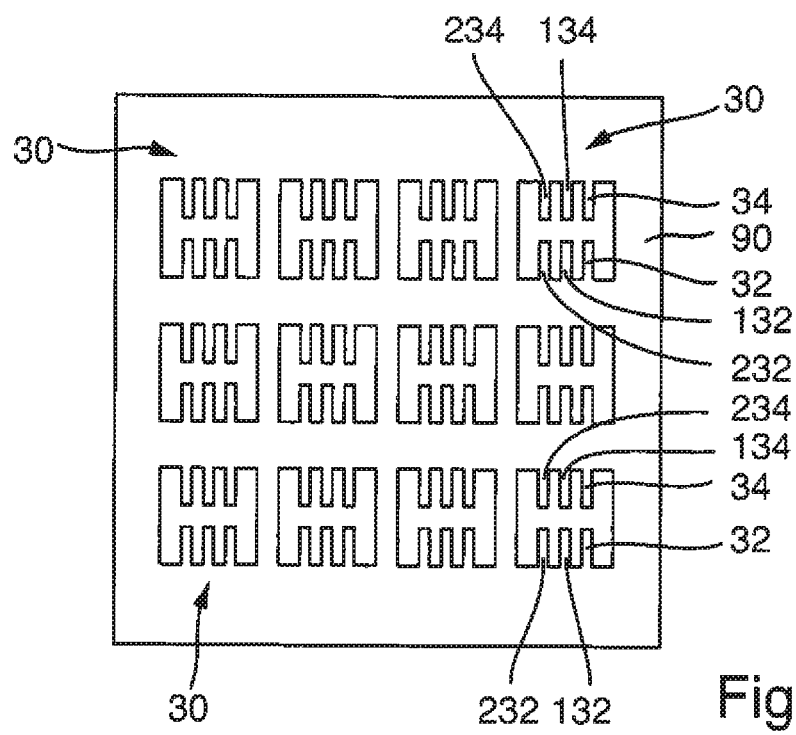
FIG. 3 is a plan view of a structure with contact elements.

The drawing in FIG. 3 shows a structure 90 of a plurality of overall twelve contacting units 30 manufactured as a PCB panel, each having six contact elements 32, 34, 132, 134, 232 and 234. The contacting units 30 are not separated and have an arrayed arrangement. The contacting units are shown in the negative mold.

Figure 4:
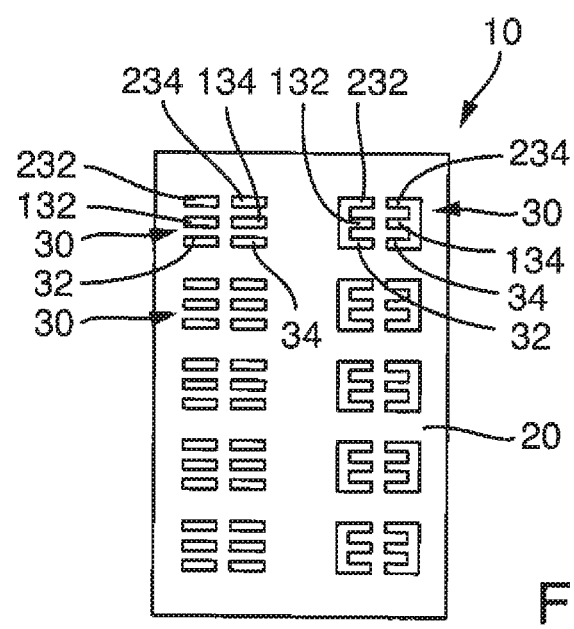
FIG. 4 is a plan view of an embodiment of the contacting device.

The illustration of FIG. 4 shows an arrangement of a total of ten contacting units 30 arranged in a column-like manner on a carrier 20. In this case, the contact elements 32, 34, 132, 134, 232 and 234 of the contacting units 30 are cut free in the left-hand column and are not completely cut free in the right-hand column.

An advantage is that a plurality of components can be contacted with the column-shaped or the arrayed arrangement, and electrical parameters of the components can be measured either in parallel or sequentially.

Figure 5:
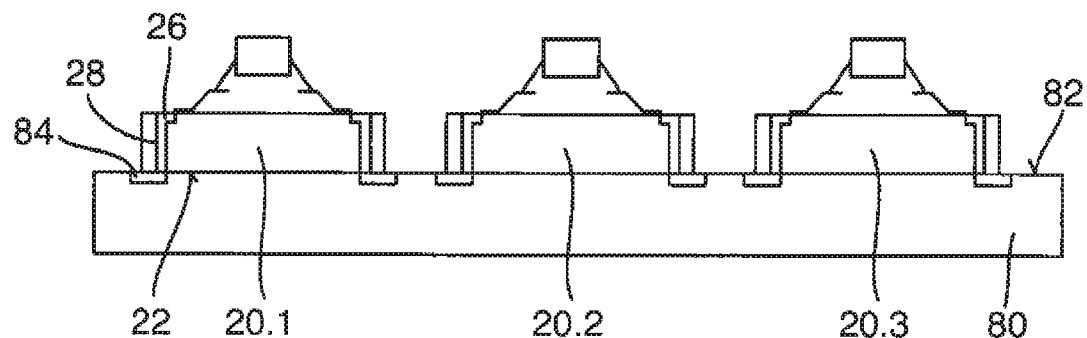
FIG. 5 is a cross-sectional view of an embodiment of the contacting device.

FIG. 5 shows a further embodiment of the contacting device 10. A plurality of carriers 20.1 and 20.1 and 20.3, each with at least one contacting unit 30, are arranged next to one another on a surface 82 of a base carrier 80. The carriers 20.1 and 20.1 and 20.3 each have a feedthrough contact 28 extending from the conductive track 26 to the bottom side 22 of the carrier. The surface 82 of the base plate also has a plurality of conductive tracks 84, each feedthrough contact 28 of the carriers 20.1 and 20.1 and 20.3 being electrically connected to a conductive track 84 for further unbundling. The bottom sides 22 of the carriers 20.1 and 20.1 and 20.3 are connected at least in some areas in a force-fitting manner to the surface 82 of the base carrier 80 and/or to at least one of the conductive tracks 84 of the base carrier 80.

Figure 6:
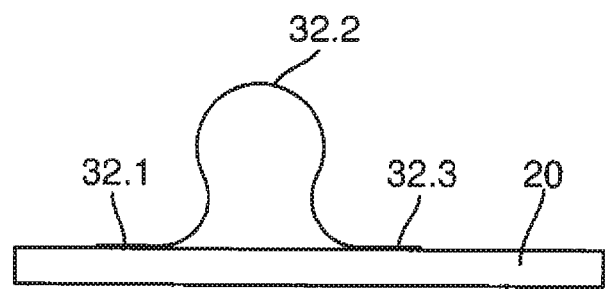
FIG. 6 is a cross-sectional view of an embodiment of a contact element of a contacting device.

FIG. 6 shows a further embodiment of a contact element 32. The contact element 32 is designed in the shape of an omega with two fixing sections 32.1 and 32.3 framing the contacting portion 32.2. An advantage is that the omega-shaped contact elements have a larger restoring force by means of the two fixing sections 32.1 and 32.3 that are distanced from each other.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A contacting device comprising:
   a carrier having a bottom side and a top side, the top side of the carrier having a plurality of mutually insulated conductive tracks; and
   at least one contacting unit having at least two contact elements that at least partially are formed of an electrically conductive material and are mutually electrically insulated, each of the at least two contact elements along a longitudinal axis L are formed of a fixing section and a contacting portion that adjoins the fixing section,
   wherein, each fixing section is supported on the top side of the carrier and has a first contact surface, and is connected to the first contact surface with one of the conductive tracks in a non-positive and electrically conductive manner,
   wherein each contacting portion is at a distance to the top side that is variable between zero and a maximum distance and is elastic in a direction extending substantially perpendicular to the top side of the carrier,
   wherein each contacting portion comprises a second contact surface facing away from the top side of the carrier in an area at a distance to the top side, and
   wherein the second contact surface of the contacting portion and the first contact surface of the fixing section are electrically conductively connected by the electrically conductive material to produce an electrical operative connection between a terminal contact of an electrical or electronic component, which is supported on the second contact surface, and one of the conductive tracks.

2. The contacting device according to claim 1, wherein each contact element is formed substantially or completely of the conductive material and is arranged at a distance from every other contact element.

3. The contacting device according to claim 1, wherein each contact element is formed substantially of a non-magnetic material.

4. The contacting device according to claim 1, wherein each contact element is formed substantially of a metal or a metallic compound and has a width between 0.02 mm and 2 mm and/or a length of 0.2 mm to 5 cm.

5. The contacting device according to claim 1, wherein each contact element is formed substantially of copper-beryllium.

6. The contacting device according to claim 1, wherein the at least one contacting unit has at least two contact elements arranged side by side and extending in parallel.

7. The contacting device according to claim 1, wherein each contact element is omega-shaped in a side view.

8. The contacting device according to claim 1, wherein each contact element is formed step-shaped with an increase in the distance up to the maximum distance which extends obliquely or S-shaped, relative to the top side of the carrier.

9. The contacting device according to claim 1, wherein the contacting device has a base carrier with a surface with a plurality of conductive tracks, wherein a plurality of carriers are arranged with the bottom side on the base carrier and are non-positively connected to the top side of the base carrier and/or the conductive tracks of the base carrier, wherein the carriers have a feedthrough contact for each conductive track which reaches from the conductive track to the bottom side of the carrier, and wherein the feedthrough contacts are electrically connected to the conductive tracks of the base carrier.

10. The contacting device according to claim 1, wherein a terminal contact of a housed integrated circuit is supported on the second contact surface of each contact element.

11. The contacting device according to claim 1, wherein a pressing device is provided in order to press a component on the second contact surfaces of the contact elements.

12. The contacting device according to claim 1, wherein the conductive tracks are arranged in several layers on the carrier.

13. The contacting device according to claim 1, wherein between the contacting portion of each contact element and the top side of the carrier, an elastic material is arranged.

14. The contacting device according to claim 1, wherein a plurality of contacting units are manufactured in a PCB plate and are arranged on the carrier.

15. The contacting device according to claim 1, wherein, in an area at the maximum distance to the top side of the carrier, a second contact surface is provided facing away from the top side of the carrier.

16. The contacting device according to claim 1, wherein the at least one contacting unit includes at least one pair of contact elements formed of a first contact element and a second contact element, wherein the longitudinal axis of the first contact element and the longitudinal axis of the second contact element are coincident with a common longitudinal axis, and wherein the first contact element is arranged mirrored to the second contact element along a common longitudinal axis.

17. The contacting device according to claim 16, wherein the at least one contacting unit has a plurality of pairs of contact elements arranged side by side and extending in parallel.

18. The contacting device according to claim 1, wherein the contacting device has at least two contacting units arranged on the carrier in order to enable simultaneous electrical contacting of several components.

19. The contacting device according to claim 18, wherein the contacting units are arranged arrayed.

20. The contacting device according to claim 19, wherein the second fixing section has a third contact surface which is connected to the second contact surface in an electrically conductive manner, the third contact surface being connected to one of the conductive tracks in a non-positive and conductive manner.

21. The contacting device according to claim 1, wherein along the longitudinal axis, each contact element has a second fixing section adjoining the contacting portion and extends in parallel to the top side of the carrier.

22. The contacting device according to claim 21, wherein the second fixing section is supported on the top side of the carrier.

23. The contacting device according to claim 21, wherein the second fixing section is non-positively connected to the top side of the carrier.

\* \* \* \* \*